United States Patent
Tsai et al.

(10) Patent No.: US 7,045,888 B2
(45) Date of Patent: May 16, 2006

(54) ULTRA THIN DUAL CHIP IMAGE SENSOR PACKAGE STRUCTURE AND METHOD FOR FABRICATION

(75) Inventors: Chen Jung Tsai, Hsinchu (TW); Chih-Wen Lin, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 34 days.

(21) Appl. No.: 10/881,058

(22) Filed: Jun. 29, 2004

(65) Prior Publication Data

US 2005/0285239 A1  Dec. 29, 2005

(51) Int. Cl.
*H01L 23/02* (2006.01)

(52) U.S. Cl. .................... 257/686; 257/777
(58) Field of Classification Search ............. 257/686, 257/723, 777
See application file for complete search history.

(56) References Cited

U.S. PATENT DOCUMENTS

| | | | |
|---|---|---|---|
| 5,523,608 A | 6/1996 | Kitaoka et al. | |
| 6,372,551 B1 | 4/2002 | Huang | |
| 6,521,881 B1 | 2/2003 | Tu et al. | |
| 6,559,539 B1 | 5/2003 | Tu et al. | |
| 6,713,857 B1 * | 3/2004 | Tsai | 257/686 |
| 6,731,015 B1 * | 5/2004 | Wu et al. | 257/796 |

* cited by examiner

*Primary Examiner*—Phat X. Cao
*Assistant Examiner*—Theresa T. Doan
(74) *Attorney, Agent, or Firm*—Stout, Uxa, Buyan & Mullins, LLP (57) ABSTRACT

A thin stacked image sensor package containing an image sensor chip and a peripheral chip. A support pad for the peripheral chip adheres to a top surface of the peripheral chip, eliminating the need for a support member that otherwise would contribute to the thickness of the package. Thermal dissipation is enhanced by exposing surfaces including a back surface of the peripheral chip.

7 Claims, 7 Drawing Sheets

ULTRA THIN DUAL CHIP IMAGE SENSOR PACKAGE STRUCTURE AND METHOD FOR FABRICATION

BACKGROUND OF THE INVENTION

1. Field of the Invention

The present invention relates generally to semiconductor fabrication methods and, more particularly, to fabrication of a thin dual chip package for an image sensor.

2. Description of Related Art

Personal devices that employ image sensors are rapidly proliferating. Personal digital assistants (PDAs) and cell phones now join digital cameras and camcorders in the family of products that frequently include image-sensing capabilities. Because of their small size and a requirement for portability, such products benefit greatly from the existence of miniature electronics. Any opportunity to reduce the size, weight, and power consumption of image sensing electronic components accrues to the utility of these personal devices and, therefore, accrues to the public in general in terms of utility and convenience.

One way of reducing the size of image sensing components is to fabricate more than one chip in a single package. For example, an image sensor chip such as a complementary metal oxide semiconductor (CMOS) image sensor or charge-coupled device (CCD) may be combined in the same package with a flash memory chip or a digital signal processor (DSP) chip. The resulting structure reduces the chip count in the product by one. Further, if two such chips can be stacked, then the area occupied by the structure can be reduced. In any case, fabricating two chips in one package reduces the amount of packaging material required to fabricate the combination which may contribute to a reduction in weight of the product.

Figure 1:
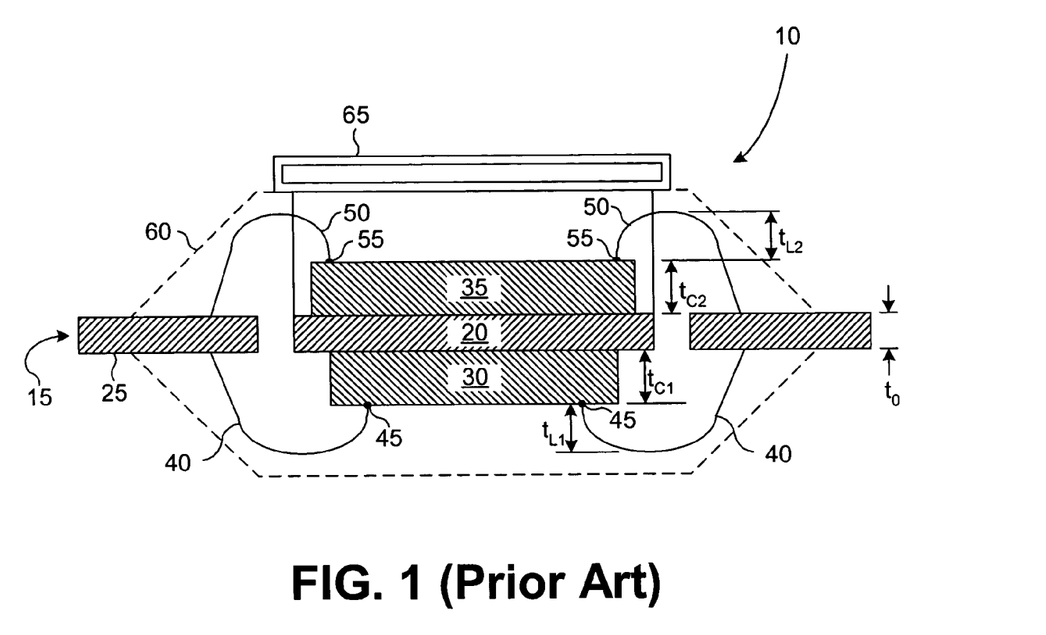
FIG. 1 is a cross-sectional diagram of a prior-art stacked image sensor package.

FIG. 1 is a cross-sectional diagram of a prior-art stacked dual chip image sensor package 10 that may appear in a device such as a digital camera. This package comprises a leadframe 15 that includes a supporting pad portion 20 and leads 25 that are used to connect components internal to the image sensor package 10 to terminals external to the image sensor package 10. The supporting pad portion 20 of the leadframe 15 supports two chips in this example. A first chip 30 is a peripheral integrated circuit such as flash memory or a DSP chip mounted on the bottom of the island portion 20 of the leadframe 15, and a second chip 35 is an image sensor chip such as a CMOS image sensor or a CCD mounted on the top of the island portion 20 of the leadframe 15. The first chip 30 has a plurality of bonding pads 45 disposed on an active surface of the first chip 30. The bonding pads 45 are connected to certain ones of leads 25 by a first plurality of wire loops 40. Likewise, the second chip 35 has a plurality of bonding pads 55 as well, the bonding pads 55 being connected to other ones of leads 25 by a second plurality of wire loops 50. The image sensor package 10 is enclosed in a plastic package, an outline 60 of which is shown in FIG. 1, and a transparent lid 65 is mounted to the plastic package to facilitate an incidence of light onto the second chip 35.

Certain parts of the structure illustrated in FIG. 1 contribute to a minimum overall thickness of the image sensor package 10, exclusive of the transparent lid 65. These parts include the first chip 30 having thickness $t_{C1}$, the island portion 20 of the leadframe 15 having thickness to, and the second chip 35 having thickness $t_{C2}$. Additionally, the height $t_{L1}$ of the first plurality of wire loops 40 and the height $t_{L2}$ of the second plurality of wire loops 50 contribute to the minimum overall thickness of the image sensor package 10.

To summarize, the minimum overall thickness of the prior art image sensor package 10 is $$T = t_{C1} + t_{C2} + t_{L1} + t_{L2} + t_0. \quad \text{Equation 1}$$

Figure 2:
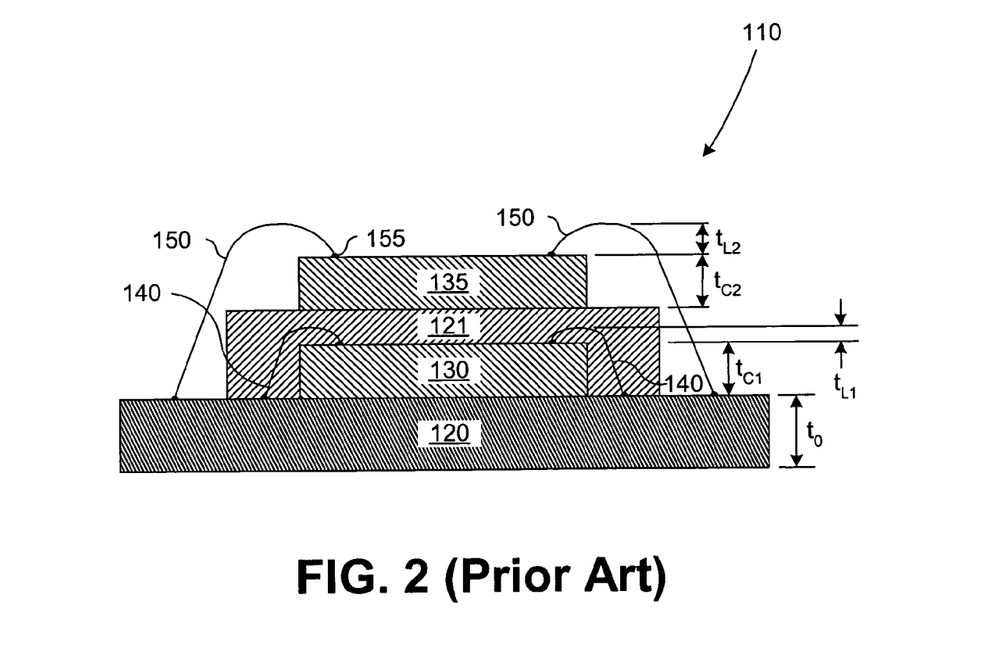
FIG. 2 is a simplified cross-sectional diagram of another prior-art stacked image sensor package.

FIG. 2 is a simplified cross-sectional diagram of another prior-art image sensor package 110. This package comprises a substrate 120 on which is mounted a first chip 130. A spacer 121 overlies the first chip 130, and a second chip 135 is mounted on the spacer 121. The first chip 130, the second chip 135, and the substrate 120 all have bonding pads, but only a representative bonding pad 155 disposed on the first chip 130 has been assigned a reference designator in FIG. 2 in order to simplify the diagram. A first plurality of wire loops 140 connect bonding pads on the first chip 130 to bonding pads on the substrate 120. Similarly, a second plurality of wire loops 150 connect bonding pads 155 on the second chip 135 to bonding pads on the substrate 120. A plastic enclosure and transparent lid (not shown) may be included as part of the prior art image sensor package 110.

As was the case for the structure of FIG. 1, certain parts of the structure illustrated in FIG. 2 contribute to a minimum overall thickness of the image sensor package 110. These parts include the first chip 130 having thickness $t_{C1}$, the substrate 120 having thickness to, and the second chip 135 having thickness $t_{C2}$. Additionally, the height $t_{L1}$ of the first plurality of wire loops 140 and the height $t_{L2}$ of the second plurality of wire loops 150 contribute to the minimum overall thickness of the image sensor package 110. Thus, the minimum overall thickness of the prior art image sensor package 110 is determined by Equation 1.

The thickness of each of the prior art examples just described includes a thickness of a support member. The example illustrated in FIG. 1 has a thickness that includes the thickness to of the island 20 of the leadframe 15 to which are mounted first and second chips 30 and 35. The example illustrated in FIG. 2 has a thickness that includes the thickness to of the substrate 120 to which is mounted the first chip 130.

As the capabilities of image sensing products continue to expand, while the demand for smaller and more lightweight products expands, a need continues in the prior art for image sensor packages that are relatively thin and lightweight compared to existing packages. A further need exists for packages that can efficiently dissipate heat generated by image sensor chips.

SUMMARY OF THE INVENTION

The present invention addresses these needs by providing a stacked image sensor package comprising an image sensor chip and a peripheral chip. A supporting pad is secured to a top active surface of the peripheral chip. The supporting pad is configured to eliminate the need for a support member that would contribute to the thickness of the image sensor package. A back surface of the peripheral chip and other surfaces can be exposed, thereby enhancing thermal dissipation.

The invention herein disclosed comprises, according to an exemplary embodiment, a peripheral chip having a first active surface and a corresponding first back surface. This exemplary embodiment further comprises a leadframe and an image sensor chip. The leadframe comprises a supporting pad disposed on the first active surface The image sensor chip has a second active surface and a corresponding second back surface, the second back surface also being secured to the supporting pad. An illustrative embodiment of the supporting pad comprises at least one elongated chip supporting bar.

The present invention further comprises a method of fabricating an image sensor package, the method comprising, according to a typical implementation, providing a peripheral chip having a first active surface and a corresponding back surface. The implementation of the method further disposes bonding pads on the first active surface and provides a leadframe having a supporting pad. The method further comprises providing disposing pad on the first active surface. The method still further provides an image sensor chip having a second active surface and a corresponding second back surface and secures the second back surface of the image sensor chip to the supporting pad.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of stacked image sensor packages. The present invention may be practiced in conjunction with various integrated circuit fabrication techniques that are conventionally used in the art, and only so much of the commonly practiced process steps are included herein as are necessary to provide an understanding of the present invention.

Figure 3A:
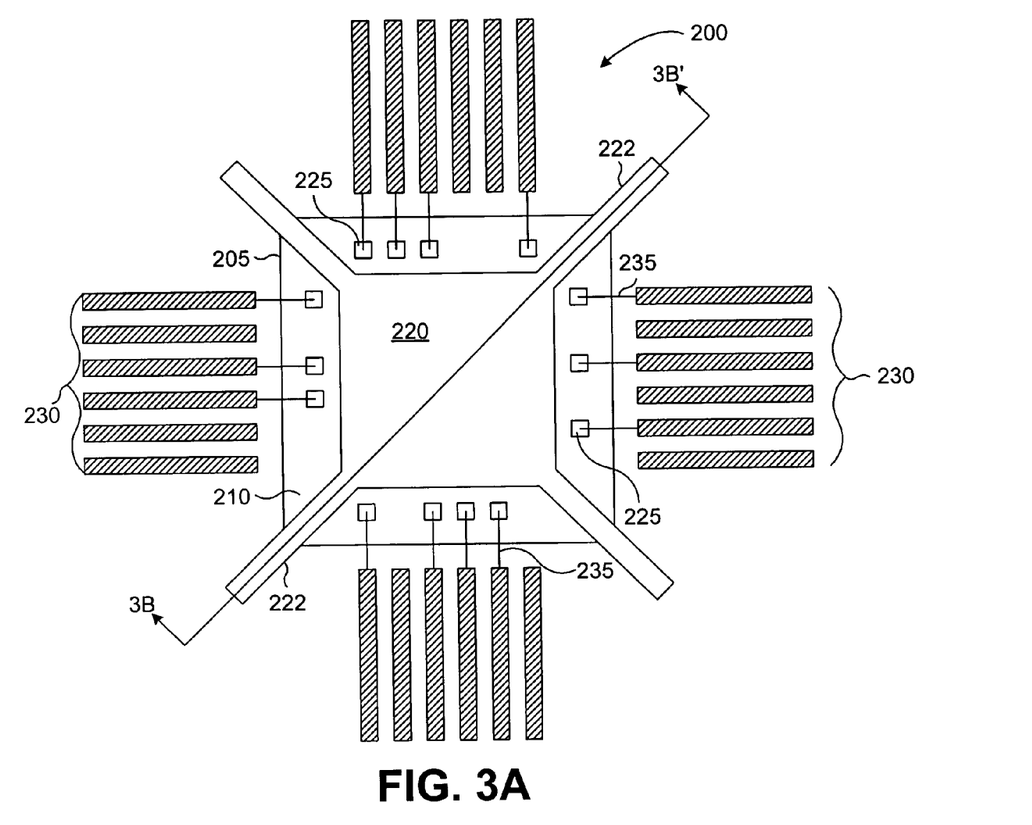
FIG. 3A is a plan view of a peripheral chip portion of an embodiment of a stacked image sensor package fabricated according to the present invention.

Referring again to the drawings, FIG. 3A is a plan view of a portion of an embodiment of a peripheral chip portion of a stacked image sensor package 200 fabricated according to the present invention. The illustrated embodiment comprises a peripheral chip 205 having a first active surface 210. A first plurality of bonding pads 225 is disposed on the first active surface 210. A leadframe comprising a supporting pad 220 is adhered to the first active surface 210 of the peripheral chip 205. In the illustrated embodiment, the supporting pad 220 comprises at least one elongated chip supporting bar 222 that extends outwardly from an edge of the active surface 210. FIG. 3A illustrates four such elongated chip supporting bars 222. The supporting pad 220 and the at least one elongated chip supporting bar 222 are formed and placed in a manner that does not interfere with the first plurality of bonding pads 225. The leadframe further comprises a plurality of leads 230. The embodiment still further comprises a first plurality of wires 235 electrically connecting the first plurality of bonding pads 225 to parts or certain ones of the plurality of leads 230. In typical embodiments, the plurality of leads 230 may provide electrical and mechanical connection to an external medium such as a printed circuit board. Additionally, other ones of the plurality of leads 230 may provide external connections for another chip in addition to the peripheral chip 205. For example, parts of the plurality of leads 230 may provide external connections for a second plurality of wires connected to another plurality of bonding pads on another chip as further described below.

Figure 3B:
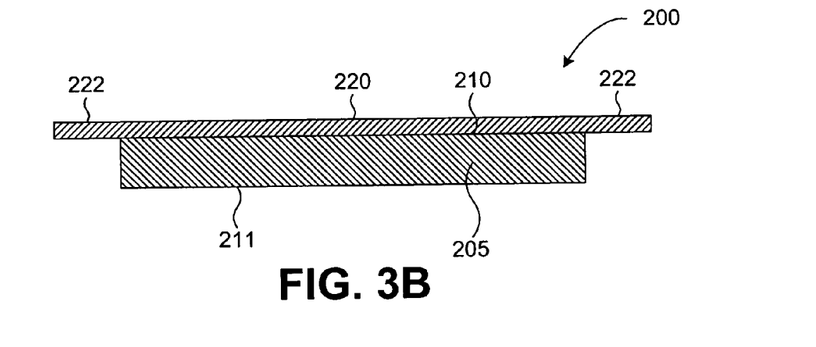
FIG. 3B is a cross-sectional view of the embodiment illustrated in FIG. 3A.

A cross-section of the peripheral chip portion of the embodiment illustrated in FIG. 3A is shown in FIG. 3B, the cross-section being taken along the line 3B–3B' of FIG. 3A. This cross-sectional view depicts the supporting pad 220, which is attached to the first active surface 210 of the peripheral chip 205. Extremities of the supporting pad 220 comprise elongated chip supporting bars 222 in the illustrated embodiment. This cross-sectional view further depicts a first back surface 211 corresponding to the first active surface 210 of the peripheral chip 205.

Figure 4:
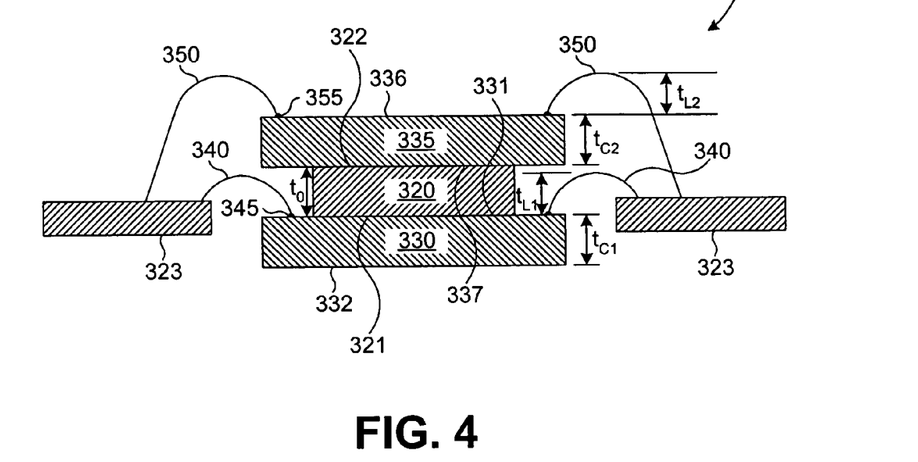
FIG. 4 is a cross-sectional diagram that depicts a portion of an embodiment of a stacked image sensor package fabricated in accordance with the present invention.

FIG. 4 is a cross-sectional view of a portion of an embodiment of a stacked image sensor package 300 fabricated in accordance with the present invention. This embodiment comprises a peripheral chip 330 having a first active surface 331 and a corresponding first back surface 332. The peripheral chip 330 comprises a first plurality of bonding pads 345 formed on the first active surface 331. The embodiment further comprises a leadframe that includes leads 323 and a first plurality of wires 340 connecting the first plurality of bonding pads 345 to the leads 323. The illustrated embodiment still further comprises a supporting pad 320 (corresponding to 220 of FIG. 3) having a first surface 321 and a second surface 322. The first surface 321 of the supporting pad 320 is disposed on the first active surface 331 of the peripheral chip 330. The first surface 321 of the supporting pad 320 may be attached to the first active surface 331 by a non-conductive adhesive that may be either a solid or a liquid.

An exemplary embodiment of the supporting pad 320 comprises an elongated chip supporting bar as illustrated in FIGS. 3A–3B. The elongated chip supporting bar 222 is placed in a manner that does not interfere with the bonding pads 345.

The embodiment illustrated in FIG. 4 further comprises an image sensor chip 335 having a second active surface 336 and a corresponding second back surface 337. The second back surface 337 can be secured to the second surface 322 of the supporting pad 320 by a non-conductive adhesive that may be either a solid or a liquid. A second plurality of bonding pads 355 are disposed on the second active surface 336 of the image sensor chip 335, and a second plurality of wires 350 connect the second plurality of bonding pads 355 to the leads 323. Although wires 340 and 350 are shown connected to leads 323, it will be apparent to those skilled in the art in this and similar figures which follow that any given two wires 340 and 350 would not typically be connected to the same lead of the plurality of leads 323.

The first plurality of wires 340 normally take a form that includes loops that extend to a height $t_{L1}$ above the first active surface 331 of the peripheral chip 330. In the present embodiment, $t_{L1}$ is less than the thickness, $t_0$, of the supporting pad 320. Likewise, the second plurality of wires 350 typically take a form including loops that extend to a height $t_{L2}$ above the second active surface 336 of the image sensor chip 335. The height $t_{L2}$ and the thickness, $t_0$, of the supporting pad 320 determine, in part, the thickness of the stacked image sensor package 300. Additional components of the thickness of the stacked image sensor package 300, exclusive of any transparent lid (not shown), include $t_{C1}$, the thickness of the peripheral chip 330, and $t_{C2}$, the thickness of the image sensor chip 335. The total thickness of the illustrated portion of the stacked image sensor package 300 can be approximated by $$T = t_{C1} + t_{C2} + t_0 + t_{L2}.$$  Equation 2

A comparison of Equation 2 with Equation 1 above illustrates that the thickness of the stacked image sensor package 300 is less than the thickness of the prior-art image sensor packages by to, the thickness of support member 20 (FIG. 1) or 120 (FIG. 2). The supporting pad 320 (see also supporting pad 220 in FIG. 3) contributes only a negligible amount to the total thickness of the image sensor package 300. This assertion is true, provided the thickness of the supporting pad 320 is chosen to be only slightly greater than the height, $t_{L1}$, of the loops formed by the first plurality of wires 340 in accordance with an aspect of the present invention.

The image sensor chip 335 in the stacked image sensor package 300 may have a light sensitive area (not shown) on the second active surface 336. In typical embodiments, the image sensor chip 335 may be a complementary metal oxide semiconductor (CMOS) chip, or the image sensor chip 335 may take the form of a charge-coupled device (CCD). The peripheral chip 330 in the stacked image sensor package 300 may comprise flash memory or a digital signal processor (DSP) as examples. Together, the image sensor chip 335 and the peripheral chip 330, when fabricated according to the present invention, may comprise a highly functional image sensor package which is thinner and which weighs less than many packages available in the prior art.

Various forms of the construction of FIG. 4 can be implemented to form specific stacked image sensor packages as will be evident to one skilled in the art. Two examples of such packages are now described.

Figure 5A:
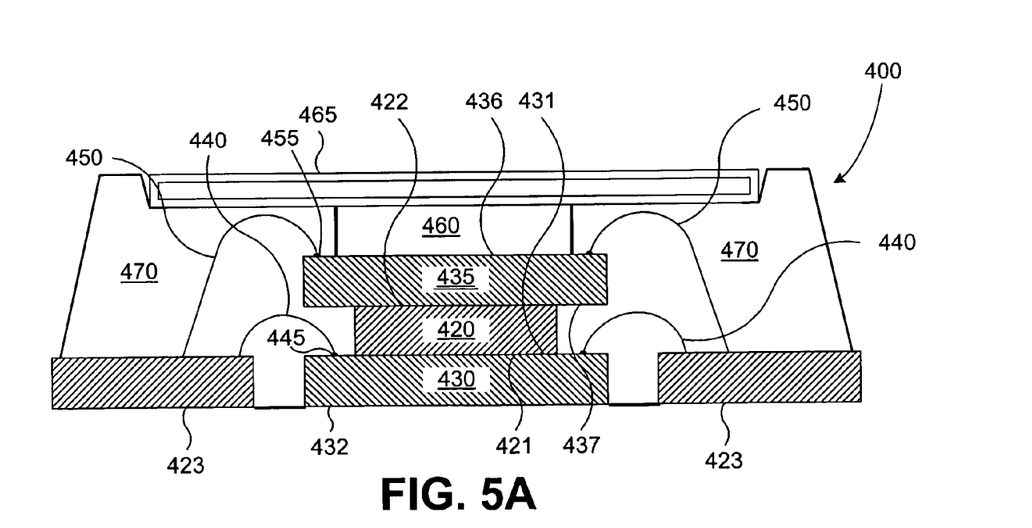
FIGS. 5A–5C are cross-sectional views of embodiments of a stacked image sensor package fabricated according to the partial embodiment depicted in FIG. 4.

FIG. 5A is a cross-sectional view of an exemplary embodiment of a stacked image sensor package 400 fabricated according to the partial embodiment depicted in FIG. 4. This embodiment comprises a peripheral chip 430 having a first active surface 431 and a corresponding first back surface 432. The embodiment further comprises a supporting pad 420 having a first surface 421 and a second surface 422. The first surface 421 of the supporting pad 420 is secured to the first active surface 431 of the peripheral chip 430 by a non-conductive adhesive. The embodiment still further comprises a leadframe, of which the supporting pad 420 is a part, the leadframe including leads 423 which in turn comprise bonding surfaces and non-bonding surfaces. The peripheral chip 430 comprises a first plurality of bonding pads 445 disposed on the first active surface 431. The embodiment further comprises a first plurality of wires 440 (i.e., parts of a plurality of wires) that connect electrically to the first plurality of bonding pads 455 and parts or certain ones of bonding surfaces of the leads 423. The first plurality of wires 440 typically is formed as loops that provide mechanical strain relief for the electrical connections.

The illustrated embodiment further comprises a chip, which as presently embodied is an image sensor chip 435, having a second active surface 436, a corresponding second back surface 437, and a second plurality of bonding pads 455 disposed on the second active surface 436. The second active surface 436 typically includes a light receiving area and a peripheral area (not shown). The second back surface 437 of the image sensor chip 435 may be secured to the second surface 422 of the supporting pad 420 by a liquid or solid non-conductive adhesive. The embodiment further comprises a second plurality of wires 450 (i.e., parts of a plurality of wires) electrically connecting the second plurality of bonding pads 455, which are disposed on the peripheral area, to other ones of bonding surfaces of the leads 423.

The embodiment in FIG. 5A comprises a plastic package 470 (i.e., an encapsulation) and a transparent lid 465 disposed on a top thereof whereby the peripheral chip 430, the image sensor chip 435, and the first and second pluralities of wires 440 and 450 are protected from moisture, dust, and mechanical damage. The transparent lid 465 may comprise one or more of a flat shape, a convex shape and a concave shape. A light receiving space 460 is disposed between the transparent lid 465 and the light receiving area on the second active surface 436 of the image sensor chip 435. The transparent lid 465 and the light receiving space 460 permit light from an external image to reach the second active surface 436 of the image sensor chip 435. The transparent lid 465 also seals the light receiving area. A portion of the second back surface 437 of the image sensor chip 435 is exposed to the light receiving space 460, which exposure may enhance the dispersion of heat generated by the image sensor chip 435. Additionally, the first back surface 432 of the peripheral chip 430 and non-bonding surfaces of the leads 423 are exposed to an external environment, which exposure may further enhance the dispersion of heat generated by the peripheral chip 430 and the image sensor chip 435. In applications, the non-bonding surfaces of the leads 423 may connect to an external substrate such as a printed circuit board (PCB). In modified embodiments, other parts of the peripheral chip 430, the supporting pad 420, the image sensor chip 435, and the first and second pluralities of wires 440 and 450 may be encapsulated in molding resin.

It should be noted that the spatial relationships of the peripheral chip 430, the supporting pad 420, the image sensor chip 435, the first plurality of wires 440, and the second plurality of wires 450 as depicted in FIG. 5A correspond, respectively, to the spatial relationships of the peripheral chip 330, the supporting pad 320, the image sensor chip 335, the first plurality of wires 340, and the second plurality of wires 350 illustrated in FIG. 4. In particular, although not specifically illustrated in FIG. 5A, the thickness of the image sensor package 400 is controlled by the thickness of the peripheral chip 430, the thickness of the image sensor chip 435, and the heights of the loops formed by the first plurality of wires 440 and the second plurality of wires 450. In accordance with modified embodiments of FIG. 5A, the light receiving space 460 may be decreased in size so that parts or all of the first plurality of wires 440, the second plurality of wires 450 and the supporting pad 420 are encased by the plastic package 470.

Figure 5B:
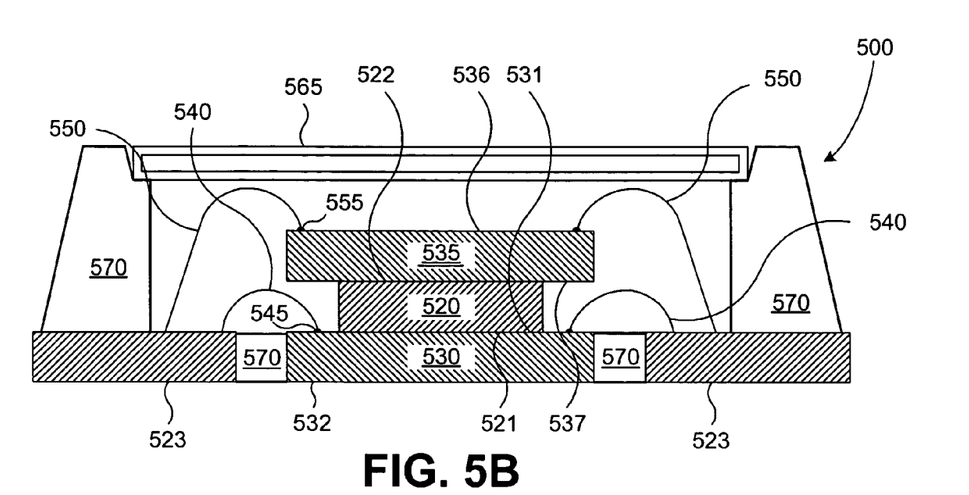

FIG. 5B is a cross-sectional diagram of another embodiment of a stacked image sensor package 500 that is similar to the embodiment illustrated in FIG. 5A except for the shape of an encapsulation 570 in FIG. 5B surrounding portions of leads 523 of leadframe 523, a supporting pad 520, a peripheral chip 530, and a chip 535, which may be an image sensor chip. In the illustrated embodiment, the encapsulation further fills gaps between leads 523 and the peripheral chip 530.

Figure 5C:
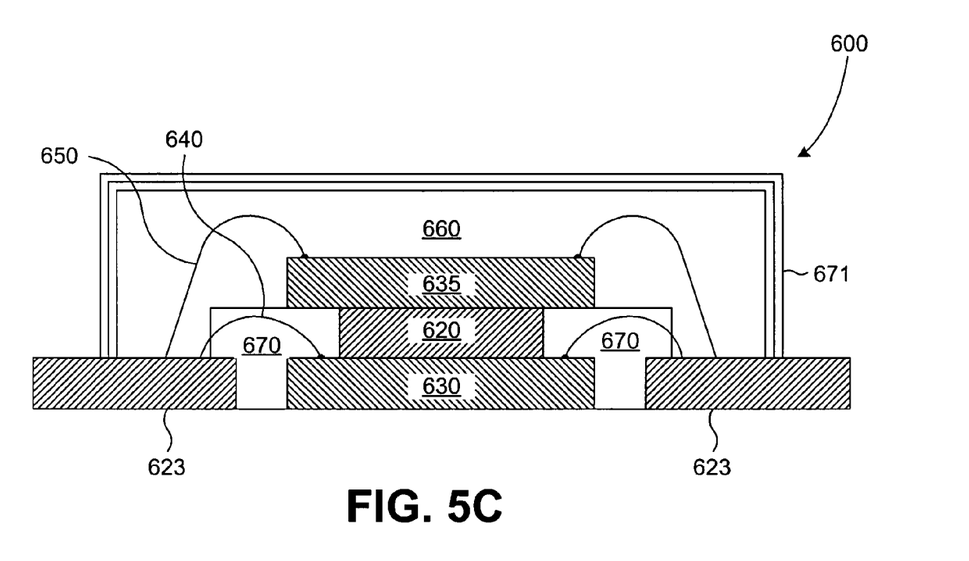

A modified embodiment of a stacked image sensor package is illustrated in FIG. 5C. Essential aspects of stacked image sensor package 600 are similar to those illustrated in FIGS. 5A and 5B. The embodiment in FIG. 5C comprises an encapsulation 670, which encloses portions of a first plurality of wires 640 but does not encapsulate portions of a second plurality of wires 650. The encapsulation also fills gaps between leads 623 and the peripheral chip 630. In a modified embodiment, the encapsulation does not enclose portions of the first plurality of wires 640 but still fills gaps between leads 623 and the peripheral chip 630 such as depicted in FIG. 5B. An enclosure 671 in the illustrated embodiment includes a transparent lid 665 and protects internal components in the package from humidity, dirt, and mechanical damage. According to exemplary embodiments, the entire enclosure may take the form of transparent lid 665 formed to have a cavity shape and the transparent lid may be directly attached onto at least one of the encapsulation 670 and the leadframe 623.

Figure 6:
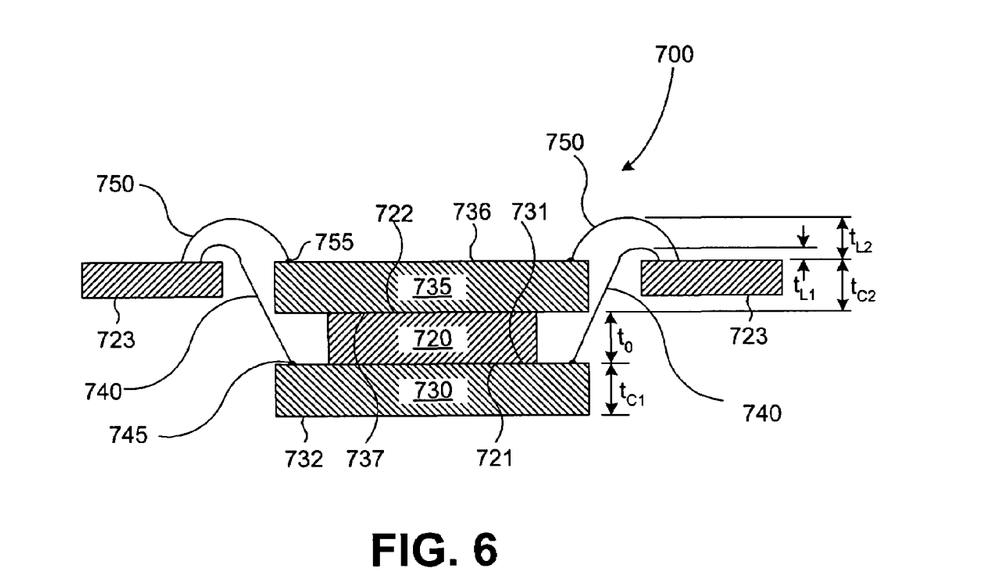
FIG. 6 is a cross-sectional diagram that describes a portion of an alternative embodiment of a stacked image sensor package fabricated according to the present invention.

FIG. 6 is a cross-sectional diagram that describes a portion of an additional embodiment of a stacked image sensor package 700 fabricated according to the present invention. This embodiment comprises a peripheral chip 730 having a first active surface 731 and a corresponding first back surface 732. A first plurality of bonding pads 745 comprising bonding surfaces and non-bonding surfaces is disposed on the active surface 731 of the peripheral chip 730. This embodiment further comprises a supporting pad 720 having a first surface 721 and a second surface 722. The supporting pad 720 may comprise an elongated chip supporting bar as described above. The first surface 721 of the supporting pad 720 is secured to the first active surface 731 of the peripheral chip 730. A liquid or solid non-conductive adhesive may be used to secure the supporting pad 720 to the peripheral chip 730. The illustrated embodiment further comprises a chip which as presently embodied is an image sensor chip 735 and leads 723. The leads 723 may be formed as part of a leadframe that also may include the supporting pad 720. The image sensor chip 735 has a second active surface 736 and a corresponding second back surface 737. A peripheral area of the second active surface 736 of the image sensor chip 735 has disposed thereon a second plurality of bonding pads 755.

The illustrated embodiment further comprises first and second pluralities of wires 740 and 750 (i.e., parts of a plurality of wires) that provide electrical connection between respective first and second pluralities of bonding pads 745 and 755 and bonding surfaces of leads 723. The first plurality of wires 745 may be placed to form a loop that extends to a height $t_{L1}$ above the second active surface 736 of the image sensor chip 735. The second plurality of wires 750 may be placed to form a loop that extends to a height $t_{L2}$ above the second active surface 736 of the image sensor chip 735.

According to the illustrated embodiment, the leads 723 are placed at a higher level than the level of the supporting pad 720. Accordingly, the height $t_{L2}$ may be greater than the height $t_{L1}$ as illustrated in FIG. 6. Other dimensions of interest in the embodiment illustrated in FIG. 6 include $t_{C1}$, the thickness of the peripheral chip 730, $t_{C2}$, the thickness of the image sensor chip 735, and $t_0$, the thickness of the supporting pad 720. The thickness of the entire portion of the illustrated image sensor package 700 is expressed by Equation 2.

Figure 7A:
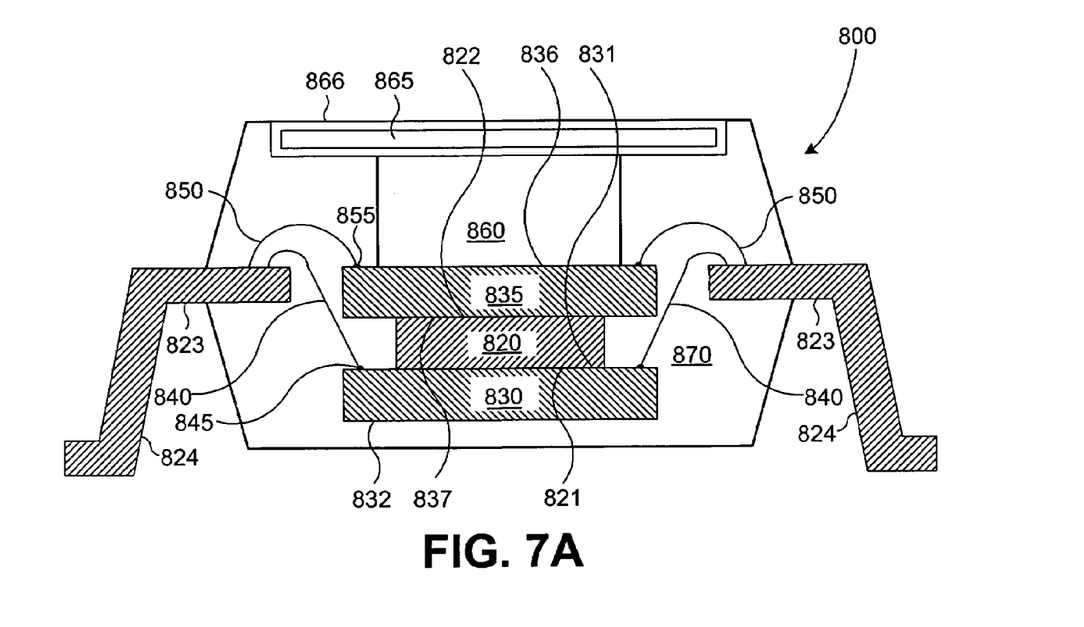
FIGS. 7A–7C are cross-sectional views of embodiments of a stacked image sensor package fabricated in accordance with the partial embodiment depicted in FIG. 6.
Figure 7B:
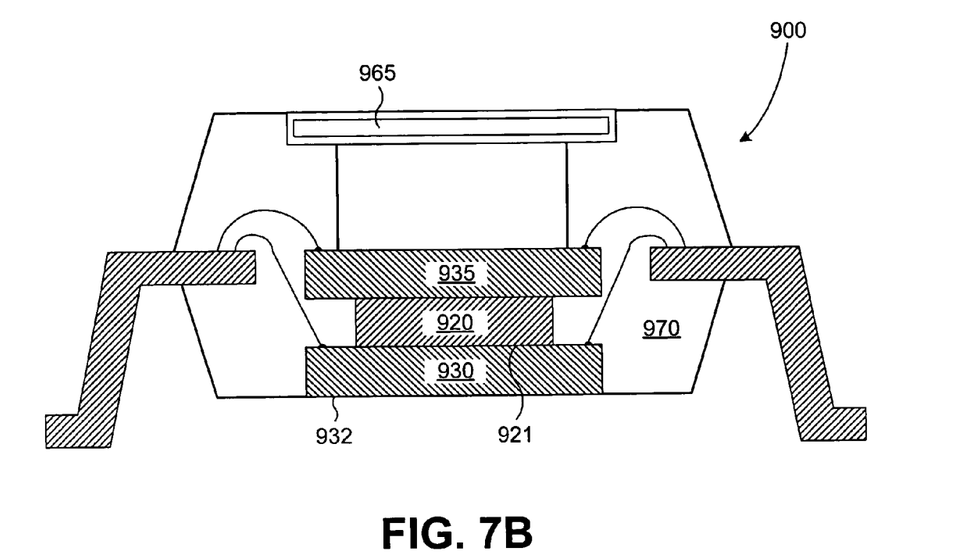
Figure 7C:
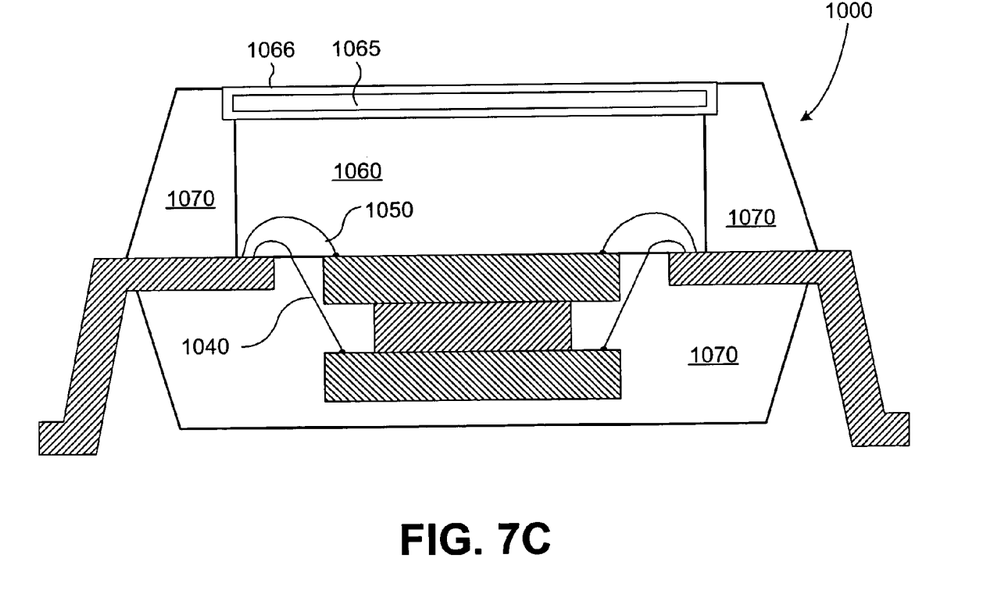

FIGS. 7A–7C are cross-sectional views of three embodiments of the present invention fabricated in accordance with the configuration of FIG. 6. FIG. 7A is a cross-sectional view of an embodiment of a stacked image sensor package 800 fabricated as described, and comprising a supporting pad 820 having a first surface 821 and a second surface 822. The embodiment further comprises a peripheral chip 830 having a first active surface 831 and a corresponding back surface 832. The first active surface 831 is secured to the first surface 821 of the supporting pad 820. The illustrated embodiment further comprises an image sensor chip 835 having a first surface 836 and a corresponding back surface 837. The back surface 837 of the image sensor chip is secured to the second surface 822 of the supporting pad 820 by a liquid or solid non-conductive adhesive.

The supporting pad 820 may comprise at least one elongated chip supporting bar as described above with reference to the elongated chip supporting bar 222 in FIG. 3. The supporting pad 820 may be part of a leadframe that further comprises leads 823 having extended outer portions 824 that may provide connection to a substrate, such as a PCB. The peripheral chip 830 may comprise a first plurality of pads 845 disposed on the first active surface 831. Likewise, the image sensor chip 835 may comprise a second plurality of pads 855 disposed on the second active surface 836. The embodiment further may comprise a first plurality of wires 840 and a second plurality of wires 850. The first plurality of wires can provide an electrical connection between the first plurality of bonding pads 845 and parts or certain ones of the leads 823. The second plurality of wires likewise can provide an electrical connection between the second plurality of bonding pads 855 and other ones of the leads 823. The relative placement of the first and second pluralities of wires 840 and 850, the peripheral chip 830, the supporting pad 820, and the image sensor chip 835 in FIG. 7A should be noted to be substantially the same as the relative placement of the respective first and second pluralities of wires 740 and 750, the peripheral chip 730, the supporting pad 720, and the image sensor chip 735 in FIG. 6. Therefore, the same considerations that led to the conclusions regarding Equation 3 apply to the embodiment illustrated in FIG. 7A. That is, the thickness of the image sensor package 800 illustrated in FIG. 7A is likewise governed by Equation 3.

The embodiment further comprises a light receiving space 860 disposed above the second active surface 836 of the image sensor chip 835. As presently embodied, the second active surface 836 comprises a light receiving area (not shown). The embodiment still further comprises a transparent lid 865 disposed above the light receiving space 860, the transparent lid 865 being capable of sealing the light receiving area. The transparent lid may comprise one or more of a flat shape, a convex shape and a concave shape. An upper surface 866 of the transparent lid 865 is positioned nominally at the same level as an upper extremity of a plastic package or encapsulation 870. The plastic package 870 may encapsulates at least a portion of the peripheral chip 830, the supporting pad 820, the image sensor chip 835, the transparent lid 865, and the first and second pluralities of wires 840 and 850. The plastic package 870 can protect the peripheral chip 830, the image sensor chip 835, and the first and second pluralities of wires 840 and 850 from humidity, dirt, and mechanical disturbance. Portions of the peripheral chip 830, the supporting pad 820, the leads 823, the image sensor chip 835, and the first and second pluralities of wires 840 and 850 may be enclosed in molding resin in modified embodiments.

FIG. 7B is a cross-sectional view of an embodiment of a stacked image sensor package 900 that is similar in many respects the embodiment depicted in FIG. 7A. The embodiment in FIG. 7B differs from the embodiment in FIG. 7A by having a transparent lid 965 placed in a partially elevated position relative to an upper extremity of a plastic package 970. Further, the embodiment in FIG. 7B exposes a first back surface 932 of a peripheral chip 930 in order to provide for enhanced dissipation of heat generated by the peripheral chip 930 and an image sensor chip 935.

FIG. 7C is a cross-sectional view of another embodiment of a stacked image sensor package 1000 that is similar in many respects to the embodiment depicted in FIG. 7A. The embodiment in FIG. 7C differs from the embodiment in FIG. 7A by having a light receiving space 1060 that is expanded relative to the light receiving space 860 illustrated in FIG. 7A. Accordingly, a greater portion of first and second pluralities of wires 1040 and 1050 lies within the light receiving space 1060 in FIG. 7C than is the case with the embodiment of FIG. 7A. The embodiment of FIG. 7C comprises a transparent lid 1065 that is disposed substantially on an upper extremity of a plastic package 1070 rather than being partially encapsulated by plastic as in the case in FIG. 7A.

Figure 8:
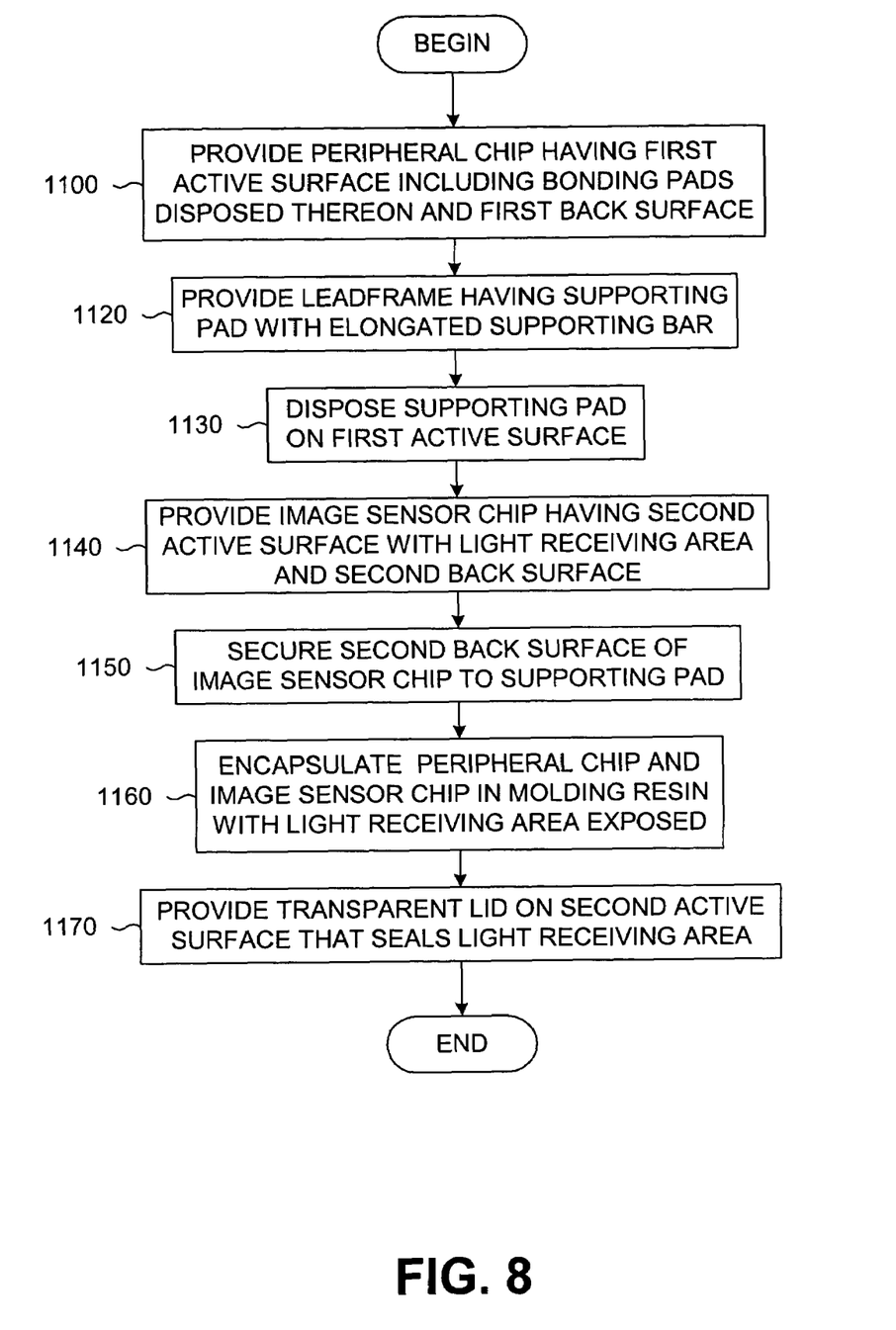
FIG. 8 is a flow diagram that describes an example of a method of fabricating a stacked image sensor package according to the present invention.

The present invention further comprises a method of fabricating a stacked image sensor package. FIG. 8 is a flow diagram that summarizes an implementation of the method. Initial steps of the method refer to the embodiment illustrated in FIG. 4. This implementation of the method of the present invention provides a peripheral chip 330 at step 1100. The peripheral chip 330 may have a first active surface 331 and a first back surface 332. Bonding pads 345 may be disposed on the first active surface 331. A leadframe comprising a supporting pad 320 is provided at step 1120. The supporting pad 320 has a first surface 321 and a second surface 322. The supporting pad 320 is disposed on the first active surface 331 at step 1130. Specifically, the first surface 321 of the supporting pad 320 is secured to the first active surface 331 of the peripheral chip 330. The supporting pad 320 may be secured to the peripheral chip 330 by a non-conductive adhesive that may take either solid or liquid form. The supporting pad 320 may comprise an elongated chip supporting bar 222 (FIG. 3).

An image sensor chip 335 is provided at step 1140. The image sensor chip 335 has a second active surface 336 and a corresponding second back surface 337. The second active surface 336 may comprise a light receiving area. The second back surface 337 of the image sensor chip 335 is secured to the second surface 322 of the supporting pad 320 at step 1150. The peripheral chip 330 and the image sensor chip 335 may be encapsulated in molding resin at step 1160. The image sensor chip 335 is encapsulated such that the light receiving area on the second active surface 336 is exposed. Additional components such as wires and leads further may be enclosed or encapsulated in molding resin as illustrated, for example, in FIGS. 5A–5C. With reference to FIG. 5A, a transparent lid 465 is provided at step 1170 that seals the light receiving area.

In view of the foregoing, it will be understood by those skilled in the art that the methods of the present invention can facilitate formation of thin dual chip packages for image sensors. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A dual chip stacked package, comprising:
   a peripheral chip having a first active surface and a corresponding first back surface, the first active surface comprising a first plurality of bonding pads;
   a leadframe comprising a plurality of leads having bonding surfaces and non-bonding surfaces and further comprising a supporting pad that includes at least one elongated chip supporting bar, the supporting pad being adhered to the first active surface in such a way as not to interfere with the first plurality of bonding pads;
   an image sensor chip having a second active surface and a corresponding second back surface, the second active surface comprising a light receiving area and a peripheral area with a second plurality of bonding pads and the second back surface being secured to the supporting pad;
   a plurality of wires, parts of which electrically connect with the first plurality of bonding pads and the leads, and parts of which electrically connect with the second plurality of bonding pads and the leads;

an encapsulation at least partially encompassing the leadframe, plurality of wires, peripheral chip, and image sensor chip, and forming a cavity over the second active surface to at least partially expose the light receiving area; and a transparent lid disposed over the cavity to direct light to the light receiving area.

2. The dual chip stacked package as set forth in claim 1, wherein the supporting pad is attached to the first active surface by a liquid or solid non-conductive adhesive.

3. The dual chip stacked package as set forth in claim 1, wherein the second back surface is attached to the supporting pad by a liquid or solid adhesive.

4. The dual chip stacked package as set forth in claim 1, wherein the transparent lid comprises one or more of a flat shape, a convex shape and concave shape.

5. The dual chip stacked package as set forth in claim 1, wherein the first back surface is exposed to enhance thermal dispersion.

6. The dual chip stacked package as set forth in claim 1, wherein the non-bonding surfaces of the plurality of leads are exposed to enhance thermal dispersion and to facilitate connection to an external substrate.

7. The dual chip stacked package as set forth in claim 1, wherein the transparent lid is formed to have a cavity shape and the transparent lid is directly attached onto the encapsulation and leadframe.

* * * * *